United States Patent
Shen

(10) Patent No.: US 6,693,038 B1
(45) Date of Patent: Feb. 17, 2004

(54) METHOD FOR FORMING ELECTRICAL CONTACTS THROUGH MULTI-LEVEL DIELECTRIC LAYERS BY HIGH DENSITY PLASMA ETCHING

(75) Inventor: Yun-Hung Shen, Taipei (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/245,563

(22) Filed: Feb. 5, 1999

(51) Int. Cl.[7] .............................................. H01L 21/311
(52) U.S. Cl. ...................... 438/700; 438/709; 438/710; 438/723
(58) Field of Search ................................ 438/700, 709, 438/710

(56) References Cited

U.S. PATENT DOCUMENTS

| | | | | |
|---|---|---|---|---|
| 4,541,892 A | * | 9/1985 | Jeuch | 156/643 |
| 5,017,511 A | * | 5/1991 | Elkind et al. | 437/225 |
| 5,167,762 A | | 12/1992 | Carr et al. | 156/657 |
| 5,314,578 A | | 5/1994 | Cathey | 156/662 |
| 5,505,816 A | | 4/1996 | Barnes et al. | 156/662.1 |
| 5,716,494 A | | 2/1998 | Imai et al. | 156/643.1 |
| 5,716,495 A | | 2/1998 | Butterbaugh et al. | 156/643.1 |
| 5,756,400 A | * | 5/1998 | Ye et al. | 438/710 |
| 5,767,017 A | | 6/1998 | Armacost et al. | 438/694 |
| 5,767,021 A | | 6/1998 | Imai et al. | 438/719 |
| 5,888,309 A | * | 3/1999 | Yu | 134/1.2 |
| 5,904,154 A | * | 5/1999 | Chien et al. | 134/1.2 |
| 5,925,577 A | * | 7/1999 | Solis | 438/725 |

* cited by examiner

Primary Examiner—Kin-Chan Chen
Assistant Examiner—Duy-Vu Deo
(74) Attorney, Agent, or Firm—George O. Saile; Stephen B. Ackerman; Stephen G. Stanton

(57) ABSTRACT

A method for forming within a dielectric layer upon a substrate within a microelectronics fabrication a series of contact via holes etched through the dielectric layer to multi-level contact layers employing reactive plasma etching methods to form the series of contact via holes. The first plasma etch method employs fluorine containing gases to form the etched via holes, and then the second plasma etch method employs oxygen and a fluorocarbon gas to complete the etching of the via holes and remove residual materials. The etched via holes access multi-level contact layers formed upon the substrate at differing heights with respect to the substrate, penetrating through at least one contact layer. This permits formation of a series of electrical contacts, between the series of contact layers and patterned conductor layers through the series of via holes, with low electrical resistances.

15 Claims, 2 Drawing Sheets

METHOD FOR FORMING ELECTRICAL CONTACTS THROUGH MULTI-LEVEL DIELECTRIC LAYERS BY HIGH DENSITY PLASMA ETCHING

BACKGROUND OF THE INVENTION

1. Field of the Invention

The invention relates to the field of manufacture of microelectronics fabrications. More particularly, the invention relates to the field of formation of via holes for low resistance electrical contacts within semiconductor integrated circuit microelectronics fabrications.

2. Description of the Related Art

The manufacture of microelectronics fabrications employing semiconductor and conductor elements requires that electrical contacts be formed between and among the several conductive and semiconductive regions and patterned layers. Such electrical contacts generally must be made so that they are ohmic in nature, i.e., they obey Ohm's law of proportionality of electric current to voltage. In addition, electrical contacts should be made reliably and with low intrinsic resistance without significant added contribution to the electrical resistances and impedances of the circuits components and connections comprising the microelectronics fabrications. While there is generally no particular difficulty meeting these requirements for metal-to-metal contacts, more complex interactions may arise when forming contacts at interfaces between metal and semiconductor layers. For example, electronic states at the interface may exist, particularly in the semiconductor portion, which may trap charges and lead to formation of interfacial potential differences which may cause apparent changes in electrical resistance, particularly in the semiconductor material. Another effect which may cause changes in electrical resistance at the contact is the possibility of chemical reaction between the metal and semiconductor materials, which may cause formation of species with intrinsically higher electrical resistance than either the metal or the semiconductor themselves.

In complex microelectronics fabrications, the electrical contacts may be required to to be formed to and/or through intermediate conductor layers separated from the other conductor layers below and/or above by the intervening dielectric layers. In these instances, the geometry of the actual contact is different from that which is afforded when electrical contacts are formed between conductor layers separated by a dielectric layer. A contact via bole formed in a dielectric layer and terminating at a conductor contact layer affords the complete area of the contact hole at the conductor layer for this purpose, whereas in the latter case of an intermediate conductor contact layer the electrical contact formed by a through-going or penetrating via contact hole, the actual contact area will be limited to the thickness of the contact layer exposed at the periphery of the penetrating contact via hole.

In microelectronics fabrications, contact via holes formed within a dielectric layer are generally patterned by chemical subtractive etch methods using a photoresist etch mask to define the contact via hole pattern. A dry etching method is commonly employed for silicon containing dielectric layers wherein plasma activated fluorine containing gases react with the silicon containing dielectric material to form volatile silicon-fluorine compounds which leave no residue in the contact via holes. While such methods arc generally satisfactory, there may be side reactions leading to the formation of solid non-conductive residual materials such as carbon-fluorine containing polymers in the etched via hole which may interfere with subsequent electrical contact. After etching of the contact via holes is complete, the photoresist mask must be removed, which may constitute an additional source of residual polymer material left within the etched via.

It is common practice in plasma etching of contact via holes in silicon containing dielectric layers to include an oxidation post-etch treatment (PET) step to minimize the residual polymer material left within the contact via hole. An oxidizing gas is admitted after the via etching to react with any polymer residues. This method is not without problems in forming contact via holes with satisfactory contact resistances. For example, oxidizing environments may form poorly conducting oxide compounds which may interfere with electrical contact within the via contact hole. The oxidizing gas may not react sufficiently to remove the polymer or other foreign material from the contact hole.

It is therefore towards the goal of forming through dielectric layers within microelectronics fabrications a plurality of etched via holes with low electrical resistance contacts that the present invention is generally directed.

Various methods and materials have been disclosed with respect to dry etching of contact via holes and forming low and reproducible contact resistances. For example, Barnes et al., in U.S. Pat. No. 5,505,816, disclose a method for selectively etching silicon dioxide layers in a plasma formed from various gases including oxygen, fluorine compounds such as CF4 and NF3, N2 and H2, to form volatile products. The process is selective with respect to silicon nitride and polysilicon being etched more slowly.

Further, Carr et al., in U.S. Pat. No. 5,167,762, disclose a method for forming an etched hole through an oxide layer superposed over a polysilicon layer employing a plasma formed in a gas mixture including O2, He, C12 and NF3 for the first portion of the etching process, and completing the etching with a gas mixture containing NF3 and HBr to insure complete removal of the polysilicide formed within the etched hole during the first part of the process.

Still further, Cathey, in U.S. Pat. No. 5,314,578, discloses a method for etching a plurality of contact via holes through a silicon dioxide layer to an underlying silicon or metal silicide conductive layer. The method employs a carbon containing etchant protective material as the patterned etching mask and a carbon-free chemical etchant system containing halogens to effect the etching of the contact via holes. A polyhalocarbon polymer coating is formed as a protective layer byproduct of the etching reaction.

Yet still further, Imai et al., in U.S. Pat. No. 5,716,494 and U. S. Pat. No. 5,767.021, disclose a method employing an interhalogen compound gas to suppress film formation during dry etching of a silicon dioxide layer. The interhalogen compound gas is XeF2. Addition of interhalogen compound gases can also be used to suppress deposition of reaction products during chemical vapor deposition (CVD) procedures.

Still further yet, Butterbaugh et al., in U.S. Pat. No. 5,716,495, disclose a method for removing oxide and other contaminant layers from silicon wafer surfaces while minimizing loss of a desired film from the wafer surface. The method employs a fluorine-containing gas which is passed over the wafer surface whilst being irradiated with ultraviolet radiation to bring about the selective removal of oxide and other contaminant layers. The absence of water, hydrogen, hydrogen fluoride and hydrogen-containing organics is essential to operation of the method.

Finally, Armacoast et al., in U.S. Pat. No. 5,767,017, disclose a method for selectively removing portions of a layer from the vertical surface of an object whilst not affecting the adjacent horizontal surface of the same body. The method employs a fluorocarbon containing etching gas within a high density plasma to effect the selective removal of vertical and corner regions of the layer. This is accomplished by the masking effect of a patterned sacrificial polymer layer formed by first plasma etching of the layer to produce the conformal carbonaceous polymer layer which is then selectively etched at the corners by a second plasma etching step. The corner and vertical regions of the masked layer can then be selectively etched away.

Desirable within the art of microelectronics fabrication are additional methods for forming contact via holes through dielectric layers within microelectronics fabrications to produce low resistance electrical contacts within those contact via holes. More particularly desirable are methods and materials for forming contact via holes employing dry etching methods which provide a plurality of low resistance electrical contacts to and through intermediate contact layers within multi-level dielectric and conductor layer structures within microelectronics fabrications.

It is towards the foregoing goals that the present invention is both generally and more specifically directed.

SUMMARY OF THE INVENTION

It is a first object of the present invention to provide a method for forming within a dielectric layer formed over a series of multi-level contact layers upon a substrate within a microelectronics fabrication a series of via holes formed to access said contact layers employing selective etching of the dielectric layer.

It is a second object of the present invention to provide a method in accord with the first object of the present invention, where there is formed within a dielectric layer upon a substrate employed within an integrated circuit microelectronics fabrication over a series of multi-level contact layers at differing heights with respect to the substrate a series of via holes selectively etched within the dielectric layer to access the series of contact layers.

It is a third object of the present invention to provide a method in accord with the first object of the present invention or the second object of the present invention, where there is formed within a dielectric layer formed over a series of multi-level contact layers upon a substrate employed within a semiconductor integrated circuit microelectronics fabrication, said contact layers being of differing heights with respect to the substrate, a series of via holes selectively etched within the dielectric layers employing a reactive plasma etch method, accessing the contact layers to permit forming a series of low electrical resistance contacts therein, employing a patterned microelectronics conductor layer.

It is a fourth object of the present invention in accord with the first object of the present invention, the second object of the present invention and/or the third object of the present invention, where the method of the present invention is readily commercially implemented.

In accord with the objects of the present invention, there is provided by the present invention a method for forming within a dielectric layer over a series of contact layers formed upon a substrate employed within a microelectronics fabrication a series of via holes etched within the dielectric layer employing selective etching methods to access the contact layers wherein the electrical resistances of the series of electrical contacts formed to the contact layers are low and reproducible. To practice the method of the present invention, there is first provided a substrate employed within a microelectronics fabrication. There is then formed upon the substrate a series of patterned microelectronics multi-level contact layers and dielectric layers wherein the contact layers are of differing heights with respect to the substrate. There is then formed over the series of contact layers a dielectric layer. There is then formed upon the dielectric layer a photoresist etching mask pattern of a series of contact vias. There is then etched a series of contact via holes within the dielectric layer through the etching mask employing a plasma activated fluorine containing etching gas in a first etching step. At least one contact layer is penetrated through by the contact via holes. There is then employed oxygen and a fluorocarbon gas in a second etching step to complete the formation of the series of contact via holes. Subsequently there are formed electrical contacts through the contact via holes to the series of contact layers employing patterned conductor layers formed upon the dielectric layer to provide a series of low electrical resistance contacts.

The present invention may be employed where the microelectronics fabrication is an integrated circuit microelectronics fabrication. The method of the present invention does not discriminate with respect to the nature of the microelectronics fabrication within which there may be formed a series of contact via holes within a dielectric layer or layers. Thus, although the method of the present invention provides value when forming a series of contact via holes within a dielectric layer or layers formed within an integrated circuit microelectronics fabrication; the method of the present invention may also be employed when forming a series of contact via holes within a dielectric layer or layers within microelectronics fabrications including but not limited to semiconductor integrated circuit microelectronics fabrications, charge coupled device microelectronics fabrications, solar cell microelectronics fabrications, ceramic substrate microelectronics fabrications and flat panel display microelectronics fabrications.

The present invention employs methods and materials which are known in the art of microelectronics fabrication but are employed in a sequence which constitutes a novel arrangement of operations to achieve the goal and objects of the present invention. Therefore the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a dielectric layer upon a substrate within a microelectronics fabrication containing multi-level contact layers a series of contact via holes etched within the dielectric layer employing plasma assisted etching methods through a patterned photoresist etch mask. The first plasma etch method employs a plasma formed within a gas mixture comprising fluorine compounds, while the second etching method employs a gas mixture comprising oxygen and a fluorocarbon. Electrical contacts are formed within the contact via holes to patterned microelectronics conductor layers to provide low electrical resistance contacts.

Referring now more particularly to FIG. 1 to FIG. 4, there is shown a series of schematic cross-sectional diagrams illustrating the results of forming in accord with the method of the present invention which is a preferred embodiment of the present invention a series of vias within a dielectric layer upon a substrate employed within a microelectronics fabrication. The dielectric layer is formed over a series of multi-level contact layers, also formed over the substrate, of differing heights with respect to the substrate. A series of via contact holes is etched through a photoresist pattern etch mask within the dielectric layer, accessing the series of contact layers and penetrating through at least one contact layer. A patterned microelectronics conductor layer is formed upon and over the dielectric layer to form a series of electrical contacts to the series of contact layers through the series of vias.

Figure 1:
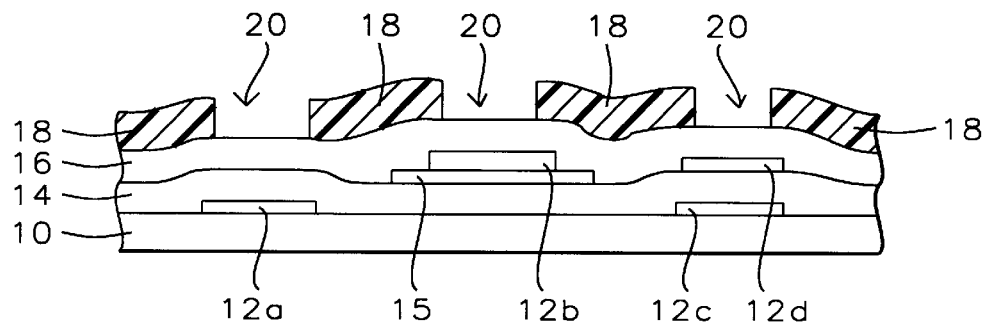
FIG. 1, FIG. 2, FIG. 3 and FIG. 4 show a series of schematic cross-sectional diagrams illustrating the results of forming within a dielectric layer within a microelectronics fabrication a series of electrical contacts through etched contact via holes to multi-level contact layers within the microelectronics fabrication. The contact via holes are formed employing a first plasma assisted etch through a patterned photoresist etching mask upon the dielectric layer employing fluorine containing gases, and a subsequent second plasma etch step employing a mixture of oxygen and fluorocarbon gases. Subsequently, a plurality of low resistance electrical contacts are formed through the contact via holes employing a patterned microelectronics conductor layer.

Referring now more particularly to FIG. 1 there is shown a schematic cross-sectional diagram of a microelectronics fabrication at an early stage in its fabrication by the method of the present invention. Shown in FIG. 1 is a substrate 10 over which is formed a series of contact layers 12a, 12b, 12c and 12d at differing heights with respect to the substrate 10 separated by dielectric layers 14 and 15. Formed over and upon the dielectric layers 14 and 15 and series of multi-level contact layers 12a, 2b, 12c and 12d is a dielectric layer 16. Formed upon the dielectric layer 16 is a patterned photoresist etch mask 18 for forming a series of via contact holes 20.

With respect to the substrate 10, the substrate 10 may be the substrate itself employed within a microelectronics fabrication, or a substrate layer formed over underlying microelectronics layers and/or a substrate within a microelectronics fabrication. The microelectronics fabrication may be chosen from a group including but not limited to microelectronics integrated circuit fabrications, microelectronics charge coupled device fabrications, microelectronics solar panel fabrications, microelectronics ceramic substrate fabrications and microelectronics flat panel display fabrications.

With respect to the multi-level contact layers 12a, 12b, 12c and 12d, the contact layers 12a, 12b, 12c and 12d may be formed from microelectronics conductor and semiconductor layer materials including but not limited to metals such as aluminum, copper, gold, titanium, tantalum, hafnium and their alloys, semiconductors such as single crystalline, polycrystalline and amorphous silicon, germanium, and their alloys, compounds such as gallium arsenide, titanium silicide, and other conductive materials as are known in the art of microelectronics fabrication. The contact layers may be formed by methods known in the art of microelectronics fabrication including but not limited to thermal vacuum evaporation, electron beam evaporation, chemical vapor deposition (CVD), physical vapor deposition (PVD) sputtering and reactive sputtering. Preferably, the contact layers 12a, 12b, 12c and 12d are formed from tungsten silicide and polysilicon materials formed employing physical vapor deposition (PVD) sputtering and chemical vapor deposition (CVD) methods respectively.

With respect to the dielectric layers 14 and 15, the dielectric layers 14 and 15 may be formed from materials such as but not limited to silicon containing dielectric materials such as silicon oxide, silicon nitride and silicon oxynitride as are known in the art of microelectronics fabrication, by methods including but not limited to chemical vapor deposition (CVD), plasma enhanced chemical vapor deposition (PECVD), physical vapor deposition (PVD) sputtering and reactive sputtering methods. Preferably the dielectric layer 14 is a silicon oxide dielectric layer formed by chemical vapor deposition (CVD) methods and the dielectric layer 15, which is employed as an etch stop layer as shown in FIG. 1, is a silicon nitride layer formed employing chemical vapor deposition (CVD) methods known in the art of microelectronics fabrication.

With respect to the dielectric layer 16, the dielectric layer 16 may be formed of materials known in the art of microelectronics fabrication, including but not limited to silicon oxide dielectric materials, silicon nitride materials and silicon oxynitride materials formed employing methods known in the art of microelectronics fabrication including but not limited to chemical vapor deposition (CVD), plasma enhanced chemical vapor deposition (PECVD), physical vapor deposition (PVD) sputtering and reactive sputtering methods. Preferably, the dielectric layer 16 is a silicon oxide layer formed by chemical vapor deposition (CVD) methods.

Figure 2:
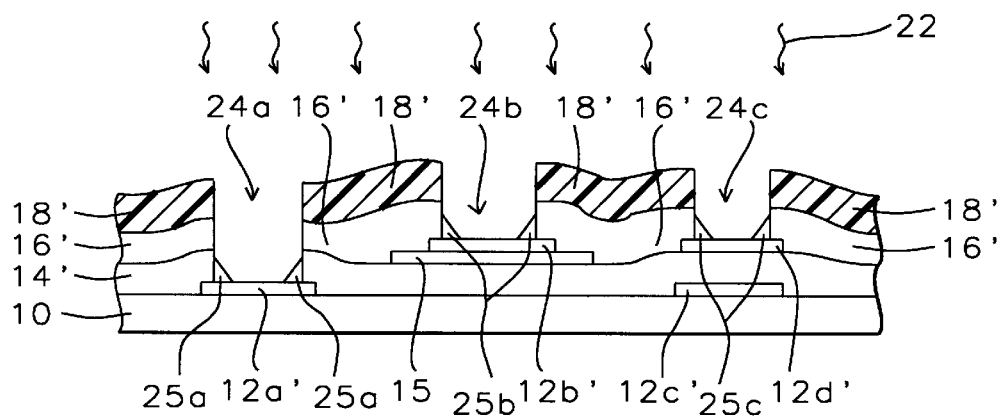

Referring now more particularly to FIG. 2, there is shown a schematic cross-sectional diagram of a microelectronics fabrication illustrating the results of further processing of the microelectronics fabrication whose schematic cross-sectional diagram is shown in FIG. 1 in accord with the method of the present invention. Shown in FIG. 2 is a microelectronics fabrication otherwise identical to the microelectronics fabrication shown in FIG. 1, but wherein there has been partially etched a series of vias 24a, 24b and 24c employing a first reactive plasma 22 as the selective etch method. The photoresist etch mask layer 18' has been partially eroded by the first reactive plasma etching step. Residual polymeric material 25a, 25b and 25c is left in the partially etched via holes 24a, 24b and 24c.

With respect to the first reactive plasma 22, the first reactive plasma 22 is formed from a gas mixture comprising fluorine containing gases. Preferably, the first reactive plasma is formed employing the following conditions: (1) a total gas pressure of from about 12 to about 18 mTorr; (2) a power of from about 800 to about 1200 watts at the top and from about 950 to about 1450 watts at the bottom of the chamber; (3) an etching gas composition in standard cubic centimeters per minute (sccm) of: 6 O2, 25 CO, 100 Ar, 10 C2F6, 5 C4F8, and 35 CH2F2; (4) an etching temperature of from about 60 to about 75 degrees centigrade; and (5) an etching time of about 325 seconds or about 40% over-etch.

With respect to the partially formed via holes 24a, 24b and 24c, the partially formed via holes 24a, 24b and 24c are not completely etched through to access the contact layers 12a, 12b, 12c and 12d even though substantial etching of the dielectric layer material of the via holes has been performed. Residual polymeric material 25a, 25b and 25c in the via holes is present because of remaining material from the dielectric layer, residual polymeric material from the etching reaction, and/or material from the erosion of the photoresist etch mask.

Figure 3:
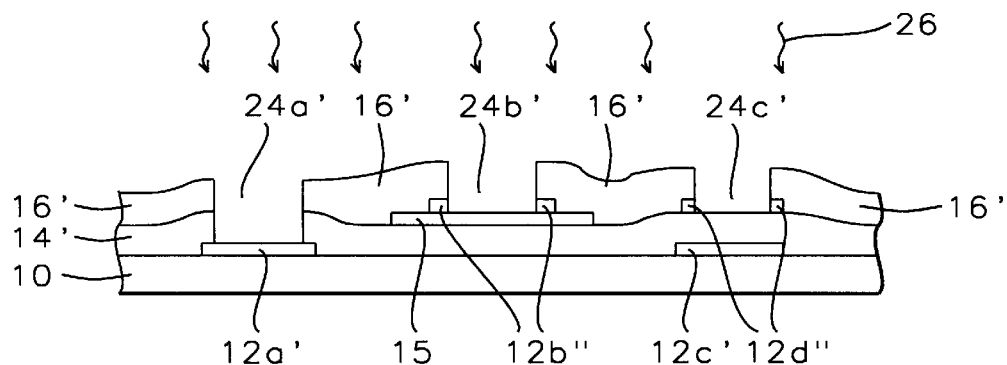

Referring, now more particularly to FIG. 3, there is shown a schematic cross-sectional diagram illustrating the results of further processing of the microelectronics fabrication whose schematic cross-sectional diagram is shown in FIG. 2 in accord with the method of the present intention. Shown in FIG. 3 is a microelectronics fabrication otherwise identical to the microelectronics fabrication shown in FIG. 2, but wherein there has been exposed the microelectronics fabrication to a second reactive plasma 26 to complete the etching of the via holes 24a', 24b' and 24c' to access the contact layers 12a, 12b, 12c and 12d. Contact layer 12b' has been penetrated and etched through to the etch stop layer 15 and contact area is left at the periphery of the etched via 12b' penetrating the contact layer 12b'. Contact layer 12d' has likewise been penetrated and etched through, leaving a peripheral contact area 12d", and in the absence of a stop layer the via etching has continued through the dielectric layer 14a' to access the contact layer 12c'.

With respect to the second reactive plasma 26, the second reactive plasma 26 is formed employing oxygen and a fluorocarbon gas. Preferably, the second reactive plasma etching method employs the following conditions: (1) a total gas pressure of from about 12 to about 18 mTorr; (2) a power of from about 950 to about 1450 watts at the top of the chamber and from about 160 to about 250 watts at the bottom of the chamber; (3) a gas flow rate of from about 600 to about 900 standard cubic centimeters per minute (sccm) O2 and from about 4 to about 7 standard cubic centimeters per minute (sccm) C2F6; (4) an etching temperature of from about 60 to about 75 degrees centigrade; and (5) an etching time of from about 45 to about 75 seconds.

Figure 4:
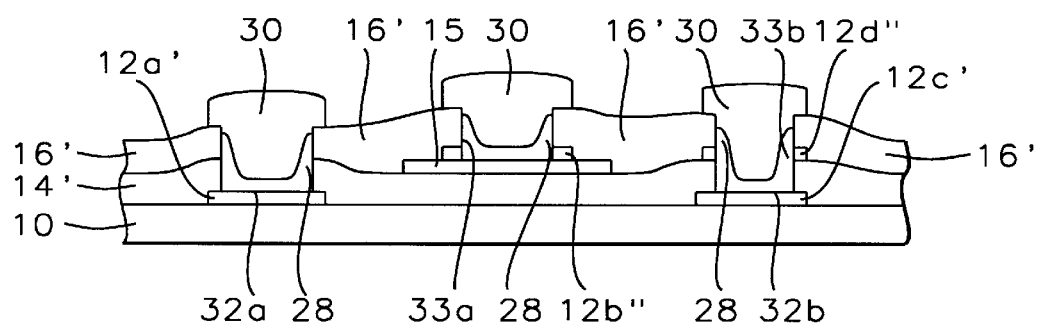

Referring now more particularly to FIG. 4, there is shown a schematic cross sectional diagram illustrating the results of further processing of the microelectronics fabrication whose schematic cross-sectional diagram is shown in FIG. 3. Shown in FIG. 4 is a microelectronics fabrication otherwise identical to the microelectronics fabrication shown in FIG. 3, but wherein there has been formed a patterned composite microelectronics conductor layer comprising a barrier material 28 and a conductor material 30, with resulting electrical contacts within the via contact holes to the surfaces of contact layers 32a and 32b, and to the periphery of contact layers 33a and 33b.

With respect to the barrier material layer 28, the barrier material layer 28 is a microelectronics barrier layer material formed employing materials and methods as are known in the art of microelectronics fabrication. Preferably, the barrier layer 28 is a composite layer formed of titanium metal and titanium nitride deposited employing a physical vapor deposition (PVD) sputtering method.

With respect to the patterned conductor material layer 30), the patterned conductor material is formed employing conductor materials and methods known in the art of microelectronics fabrication. Preferably, the patterned conductor layer 30 is formed from aluminum-copper deposited employing thermal vacuum evaporation.

With respect to the electrical contacts 32a and 32b, and the electrical contacts 33a and 33b, the electrical contacts 32a and 32b are made between the contact layer areas at the bottom of the via holes, whereas the contacts 33a and 33b are made at the periphery of the via holes where the contact layers are exposed. In particular, the electrical contacts 33a and 33b are more susceptible to high electrical resistance due to residual material because their peripheral and vertical nature provide a small contact area, and the method of the present invention is advantageous to assure by means of the second plasma etch method the removal of any residual material without excessive removal of contact layer material from the periphery.

The titanium metal/titanium nitride barrier material reaction with the contact layer material at the periphery may result in loss of conductive material and the formation of vacancies or voids which interfere with electrical contact in those regions. This is particularly true of contact layers formed of silicon. In this case, the second plasma etch step may be advantageous to remove additional silicon oxide, so that a resulting thin layer of titanium present is sufficient to make electrical contact but insufficient to react with enough silicon so as to create vacancies or voids leading to gaps interfering with electrical contact.

The method of the present invention minimizes the difficulty experienced in the prior art wherein a single reactive plasma etching step analogous to the first reactive plasma etching step of the present invention is employed to etch via holes to a greatly over-etched degree. In that case, a great deal of over-etching to insure complete etching of the via contact hole, will also result in excessive loss of the photoresist etch mask, with resulting loss of pattern integrity.

EXAMPLES

The method of the present invention was employed to fabricate a series of microelectronics fabrications comprising a series of electrical contacts through vias formed in a silicon oxide dielectric layer between multi-level contact layers and conductor layers. The control samples, which are representative of the state of the prior a consisted of microelectronics fabrications wherein the via etching was accomplished employing only the first reactive plasma method employing fluorine containing gases to etch the contact via holes to completion. The experimental samples, which are representative of the method of the present invention, were fabricated in the same manner but with the second reactive plasma etching method of oxygen and fluorocarbon gases to etch the via contact holes completely employed in addition to the first reactive plasma etching method. Both sample microelectronics fabrications employed titanium metal/ titanium nitride barrier layers within the etched via contact holes and aluminum-copper conductor layers to form electrical contacts to the underlying multi-level polysilicon and tungsten silicide contact layers through the via contact holes. Electrical resistance measurements were made employing conventional four-point measurement methods.

There are two types of electrical contacts which were measured in the samples. The first type is an electrical contact between the doped silicon p-Well region of the microelectronics fabrication and aluminum-copper conductor layer, designated as P+. The results for the control sample and for the experimental sample fabricated in accord with the method of the present invention are shown in Table I. The data given in Table I are the mean value for the electrical resistance, the range of the values and the yield for both samples.

TABLE I

|  | R, ohms | range, ohms | yield, % |
|---|---|---|---|
| Control | 4970.3 | 331–223,300 | 62.5 |
| Experiment | 330.3 | 322.6–407 | 100 |

The electrical resistances measured for the experimental sample are distributed over a much smaller range than for the control sample and have a smaller mean value. The corresponding data for electrical contacts between the aluminum-copper conductor layer and the penetrated etched-through polysilicon contact layer, designated as P4, are given in Table II.

TABLE II

|  | R, ohms | range, ohms | yield, % |
|---|---|---|---|
| Control | — | 180–open | 11 |
| Experiment | 127 | 114–134 | 94 |

The method of the present invention is seen to produce both a lower range of electrical resistance and a much higher yield of measurable contact resistances than the conventional method used as a control sample. In particular, the results shown in Table II indicate the benefits and advantages of the present invention when a via contact hole is to be etched through and penetrate a contact layer formed of silicon, where the small area of peripheral contact and the reactivity of silicon make it more difficult to form low electrical resistance contacts than it would be to large-area metallic contact layers at the bottom of etched via contact holes.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for forming a series of vias through a dielectric layer comprising:

providing a substrate;

forming over the substrate a series of one or more contact layers at one or more levels of differing heights with respect to the substrate;

forming over said series of contact layers one or more silicon containing dielectric layer formed employing plasma enhanced chemical vapor deposition (PECVD) method, where the surface of said dielectric layer has a series of differing heights with respect to said series of contact layers;

forming upon said dielectric layers a patterned photoresist layer which defines the locations of a series of vias to be formed through said dielectric layer accessing the series of contact layers;

etching, while employing a first etch method, the series of via holes through the dielectric layer to form one or more patterned dielectric layer which accesses the series of contact layers, where at least one upper lying contact layer is penetrated by the via hole formed contacting the upper lying contact layer; the first etch method being conducted at the following parameters: a total gas pressure of from about 12 to 18 mTorr; a top power of from about 800 to 1200 watts; a bottom power of from about 950 to 1450 watts; a gas flow rate of about 6 sccm $O_2$; a gas flow rate of about 25 sccm CO; a gas flow rate of about 100 sccm Ar; a gas flow rate of about 10 sccm $C_2F_6$; a gas flow rate of about 5 sccm $C_4F_8$; a gas flow rate of about 35 sccm $CH_2F_2$; a temperature of from about 60 to 75° C.; and a time of from about 325 seconds; whereby the first etch method forms polymeric residue within the series of via holes; and etching, while employing a second etch method, the patterned photoresist layer from the patterned dielectric layer, the second plasma etch method employing an jibe oxygen and fluorocarbon containing gas mixture at the following conditions: a total gas pressure of from about 12 to 18 mTorr; a top power of from about 950 to 1450 watts; a bottom power of from about 160 to 250 watts; a gas flow rate of from about 600 to 900 sccm $O_2$; a gas flow rate of from about 4 to 7 sccm fluorocarbon; a temperature of from about 60 to 75° C.; and a time of from about 45 to 75 seconds; whereby the second etch method removes the polymeric residue from within the series of via holes.

2. The method of claim 1 wherein by employing the fluorocarbon containing gas within the second plasma etch method there is provided a lower electrical contact resistance to the series of contact layers.

3. The method of claim 1 wherein the microelectronics fabrication is chosen from the group consisting of:

integrated circuits microelectronics fabrications;

charge coupled device microelectronics fabrications;

solar cell microelectronics fabrications;

ceramic substrate microelectronics fabrications; and flat panel display microelectronics fabrications.

4. The method of claim 1 wherein the series of contact layers is chosen from the group consisting of:

microelectronics conductor layers; and microelectronics semiconductor layers.

5. The method of claim 1 wherein the first etch method is dry plasma assisted etching employing gases comprising fluorine containing gases.

6. The method of claim 1 wherein the second etch method employs a mixture of gases comprising oxygen and a fluorine containing gas.

7. The method of claim 6 wherein the fluorine containing gas is selected from the group consisting of:

hexafluoroethane;

perfluoroethylene; and difluoromethane.

8. A method for forming within a silicon containing dielectric layer upon a semiconductor substrate within an integrated circuit microelectronics fabrication a series of electrical contacts within a series of vias comprising:

providing a semiconductor substrate;

forming over the semiconductor substrate one or more patterned microelectronics contact layers of differing height with respect to the substrate;

forming over the series of patterned multi-level contact layers one or more silicon containing dielectric layer formed employing plasma enhanced chemical vapor deposition (PECVD) method, where the surface of said dielectric layer has a series of differing heights with respect to the series of contact layers;

forming upon said silicon containing dielectric layer a patterned photoresist mask layer which defines the locations of a series of contact via holes to be formed through said dielectric layer, accessing the series of contact layers;

etching, while employing a first etch method the series of contact via holes through the silicon containing dielectric layer to form a patterned dielectric layer which accesses the series of multi-level contact layers, where at least one upper lying contact layer is penetrated by the contact via hole formed contacting the upper lying contact layer; the first etch method being conducted at the following parameters: a total gas pressure of from about 12 to 18 mTorr; a top power of from about 800 to 1200 watts; a bottom power of from about 950 to 1450 watts; a gas flow rate of about 6 sccm $O_2$; a gas flow rate of about 25 sccm CO; a gas flow rate of about 100 sccm Ar; a gas flow rate of about 10 sccm $C_2F_6$; a gas flow rate of about 5 sccm $C_4F_8$; a gas flow rate of about 35 sccm $CH_2F_2$; a temperature of from about 60 to 75° C.; and a time of from about 325 seconds; whereby the first etch method forms polymeric residue within the series of via holes;

etching, while employing a second etch method, the patterned photoresist layer from the patterned dielectric layer, the second plasma etch method employing a plasma containing oxygen and fluorocarbon gases at the following conditions: a total gas pressure of from about 12 to 18 mTorr; a top power of from about 950 to 1450 watts; a bottom power of from about 160 to 250 watts; a gas flow rate of from about 600 to 900 sccm $O_2$; a gas flow rate of from about 4 to 7 sccm fluorocarbon; a temperature of from about 60 to 75° C.; and a time of from about 45 to 75 seconds; whereby the second etch method removes the polymeric residue from within the series of via holes;

forming over and within the patterned silicon containing dielectric layer and the series of vias a microelectronics barrier layer and a microelectronics conductor layer to make electrical contact to intermediate and underlying multi-level contact layers; and patterning the microelectronics conductor layer to form electrical circuits with low resistance electrical contacts within the series of contact via holes.

9. The method of claim 8 wherein the semiconductor substrate is a silicon substrate.

10. The method of claim 8 wherein the series of multi-level contact layers is chosen from the group of microelectronics conductor materials comprising:
single crystal silicon;
polycrystalline silicon;
amorphous silicon;
germanium;
silicon-germanium alloys;
gallium arsenide; and
tungsten silicide.

11. The method of claim 8 wherein the barrier layer is a composite layer comprising titanium metal and titanium nitride.

12. The method of claim 8 wherein the microelectronics conductor layer is formed of aluminum-copper alloy material deposited by thermal vacuum evaporation.

13. The method of claim 8 wherein the first etch method is dry plasma assisted etching employing gases comprising fluorine-containing gases.

14. The method of claim 8 wherein the second etch method employs a mixture of gases comprising oxygen and a fluorine containing gas.

15. The method of claim 14 wherein the fluorine containing gas is selected from the group comprising:
hexafluoroethane;
perfluoroethylene; and
difluoromethane.

* * * * *